United States Patent
Abhishek et al.

(10) Patent No.: US 10,157,087 B1
(45) Date of Patent: Dec. 18, 2018

(54) ROBUST BOOT BLOCK DESIGN AND ARCHITECTURE

(71) Applicant: NXP USA, Inc., Austin, TX (US)

(72) Inventors: Kumar Abhishek, Austin, TX (US); Srikanth Jagannathan, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/649,827

(22) Filed: Jul. 14, 2017

(51) Int. Cl.
*G06F 9/52* (2006.01)
*H03L 7/099* (2006.01)
*G06F 1/08* (2006.01)

(52) U.S. Cl.
CPC ............ *G06F 9/524* (2013.01); *H03L 7/0995* (2013.01); *G06F 1/08* (2013.01)

(58) Field of Classification Search
None
See application file for complete search history.

(56) References Cited

U.S. PATENT DOCUMENTS

| | | | |
|---|---|---|---|
| 4,803,682 A | 2/1989 | Hara et al. | |
| 5,019,717 A | 5/1991 | McCurry et al. | |
| 5,073,853 A | 12/1991 | Johnson | |
| 5,440,603 A | 8/1995 | Sugita | |
| 5,638,510 A | 6/1997 | Ishikawa | |
| 5,652,836 A | 7/1997 | Park | |
| 6,212,134 B1 | 4/2001 | Yamashita | |
| 6,378,083 B1 | 4/2002 | Yamanaka et al. | |
| 8,319,524 B1 | 11/2012 | Cheng et al. | |
| 2014/0003418 A1* | 1/2014 | Khait | A61B 5/061 370/350 |
| 2016/0056807 A1* | 2/2016 | Neidengard | H03K 5/1565 327/175 |

\* cited by examiner

*Primary Examiner* — Cassandra Cox (57) ABSTRACT

A clock generator circuit includes an internal reference clock generator, a sequential circuit, and a pulse generator circuit. The internal reference clock generator circuit receives a clock buffer signal, a reset signal, and provides a first clock signal. The sequential circuit receives the first clock signal, and provides an internal reference clock signal based on the first clock signal. The pulse generator circuit receives the internal reference clock signal, a slow ring oscillator clock signal, and the reset signal. The pulse generator circuit counts a number of internal reference clock signals cycles for each cycle of the slow ring oscillator clock signal, and generates a pulse signal in response to the number being equal to zero during a cycle of the slow ring oscillator clock signal. The pulse signal toggles the flip-flop clock circuit to recover from a deadlock.

20 Claims, 5 Drawing Sheets

ROBUST BOOT BLOCK DESIGN AND ARCHITECTURE

FIELD OF THE DISCLOSURE

The present disclosure relates generally to digital systems and methods, and more particularly to internal reference clock circuitry.

BACKGROUND

A microcontroller unit (MCU) or other integrated circuit can include internal reference clock (IRC) circuitry that provides a reference clock during a boot cycle of the MCU. The IRC circuitry can include a sequential circuit, and as the output of the sequential circuit toggles, the IRC clock signal provided by the IRC circuitry also toggles. An initial state of the sequential circuit should be defined at the start-up of the IRC circuitry. The initial state of the sequential circuit can be ensured through a reset pin of the flip-flop, which can be a voltage indicator for the power supplies of the IRC circuitry. However, different situations can arise that can cause the IRC circuitry to deadlock or to glitch, and in these situations the IRC clock signal is no longer provided by the IRC circuitry to the MCU or integrated circuit. For example, if the sequential circuit attains a wrong state, then a feedback loop within IRC circuitry can be deadlocked. Another situation is that noise on a power supply voltage provided to the IRC circuitry can also cause the IRC circuitry to deadlock. Further, an asynchronous reset signal can cause a glitch in the output clock signal. Therefore, a component is needed within the IRC circuitry to prevent IRC circuitry deadlocks and glitches.

BRIEF DESCRIPTION OF THE DRAWINGS

The present disclosure may be better understood, and its numerous features and advantages made apparent to those skilled in the art by referencing the accompanying drawings. It will be appreciated that for simplicity and clarity of illustration, elements illustrated in the Figures have not necessarily been drawn to scale. For example, the dimensions of some elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF THE DRAWINGS

An integrated circuit includes an internal reference clock (IRC) generator, a sequential circuit, and a pulse generator. During operation, a reset signal is provided to each of the IRC generator, the sequential circuit, and the pulse generator. The receipt of the reset signal, by the sequential circuit, can cause the IRC clock signal provided at an output terminal of the sequential circuit to be in a defined state, such as either a high or low voltage state. The IRC clock signal can then be provided to a clock input of the IRC generator and to a clock input terminal of the pulse generator. The reset signal and a state of the sequential signal, also referred to as the IRC clock signal, CK_BUF, can combine to cause the IRC generator to generate an internal clock signal, CK_INT, on its output terminal, which in turn is provided to the sequential circuit. The internal clock signal, CK_INT, from the IRC generator can cause the IRC clock signal, CK_BUF, from the sequential circuit to switch from a high to low state or from a low to a high state in response to each rising edge of the internal clock signal, CK_INT, from the IRC generator.

The pulse generator can be in a feedback loop with sequential circuit to monitor the output clock signal. A slow ring oscillator provides a "ring clock signal" having a period that is selected to be longer than that of the IRC output clock, CK_BUF to the pulse generator. The pulse generator can count the number of IRC output clock edges received during each period of the ring clock signal. If pulse generator determines that the number of IRC output clock edges is equal to zero for any period, then it can be determined that an IRC deadlock has occurred. In an embodiment, an IRC deadlock is any event that can cause the output clock signal to remain in a single state, either high or low, without toggling to the other state. In response to a determination of an IRC deadlock, a high state pulse is provided by the pulse generator to the sequential circuit. The high state pulse can cause the output clock signal to change state and thereby recover out of the deadlock. Specific embodiments will be better understood with reference to FIG. 1 through FIG. 5.

Figure 1:
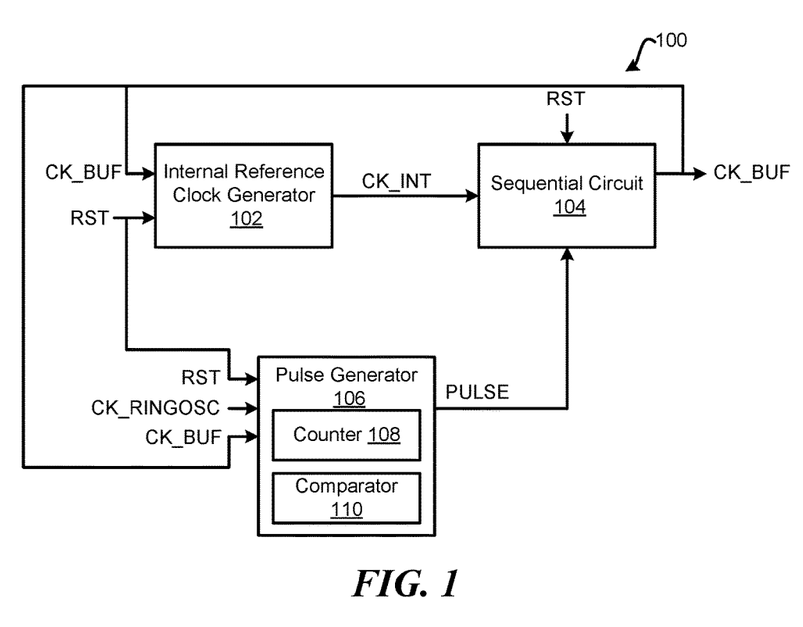
FIG. 1 illustrates a block diagram of an integrated circuit according to at least one embodiment of the present disclosure.

FIG. 1 illustrates a block diagram of an integrated circuit 100 according to at least one embodiment of the present disclosure. The integrated circuit 100 includes an internal reference clock (IRC) generator 102, a sequential circuit 104, and a pulse generator 106. The IRC generator 102 includes a first input terminal to receive a clock buffer signal, labeled CK_BUF, a second input terminal to receive a reset signal, labeled RST, and an output terminal to provide an internal clock signal, labeled CK_INT. The sequential circuit 104 includes a first input terminal connected to the output terminal of the IRC generator 102, a second input terminal to receive the reset signal, a third input terminal, an output terminal to provide a buffered IRC clock signal, labeled CK_BUF. The pulse generator 106 includes a first input terminal to receive the reset signal, a second input terminal to receive a slow ring oscillator clock signal, labeled CK_RINGOSC, a third input terminal connected to the first output terminal of the sequential circuit 104 to receive the IRC clock signal, and an output terminal connected to the third input terminal of the flip-clop circuit 104.

During operation, a reset signal, RST, is provided to each of the IRC generator 102, the sequential circuit 104, and the pulse generator 106. The asserted reset signal places the IRC clock signal, CK_BUF, on the first output terminal the sequential circuit 104 in a defined state, such as either a high logic/high voltage state or low logic/low voltage state. The defined state of CK_BUF is then provided to the first input of the IRC generator 102 and to the third input terminal of the pulse generator. The reset signal, RST, and the state of the IRC clock signal, CK_BUF, can combine to cause the IRC generator 102 to generate an internal clock signal, CK_INT, on its output terminal, which in turn is provided to the sequential circuit 104. The internal clock signal, CK_INT, from the IRC generator 102 can cause the output signal CK_BUF to switch from a high to low state or from a low to a high state in response to each rising edge of the clock signal, CK.

The pulse generator can begin monitoring the feedback of the IRC clock signal, CK_BUF, as soon as the reset, RST, signal is negated, such as switched to a low voltage state. A slow ring oscillator (not shown) can provide a ring clock signal, CK_RINGOSC, to the pulse generator 106. In an embodiment, the ring clock signal can have a slower clock cycle as compared to the desired clock cycle of CK_BUF. While the description herein, discloses a ring oscillator to generate the clock signal, CK_RINGOSC, provided to the pulse generator 106, the clock signal, CK_RINGOSC, need not be generated by a ring oscillator but may be generated by any component capable of generating a clock signal without varying from the scope of the disclosure. The pulse generator 106 can include a counter 108 to count a number of clock edges of the IRC clock signal during a single period of the ring clock signal, CK_RINGOSC. In an embodiment, the clock edges of the IRC clock signal can be determined by detecting and counting the number of rising edges of the IRC clock signal. In another embodiment, the clock edges of the IRC clock signal can be determined by detecting and counting the number of falling edges of the IRC clock signal, or both rising and filling, without varying from the scope of this disclosure. The pulse generator 106 can include a comparator 110 that can compare the number of IRC clock edges counted to a value of zero. In response to the end of a CK_RINGOSC clock cycle, the count of the IRC clock edges is provided to the comparator 110. If the comparator 110 determines that the number of IRC clock edges is equal to zero, then an IRC deadlock is determined. In an embodiment, the IRC deadlock is presumed to cause the internal clock signal, CK_INT, from the ICR generator 102 to remain in a high voltage state as described below. However, in another embodiment, the IRC deadlock can cause the internal clock signal, CK_INT, from the ICR generator 102 to remain in a low voltage state. In an embodiment, the IRC deadlock is any event that can cause the IRC clock signal to remain in a single state, either high or low, without toggling to the other state. In response to an IRC deadlock, an asserted signal is provided to the sequential circuit 104.

The high state pulse can then cause an additional clock edge to be provided to the sequential circuit 104, which in turn can cause the IRC clock signal, CK_BUF, to change state and thereby recover out of the deadlock. For example, the clock edge provided by the pulse from the pulse generator 106 can change the output state of the sequential circuit 104, CK_BUF, from a high voltage state to a low voltage state, which in turn can cause the IRC generator to recover from a deadlock state.

Figure 2:
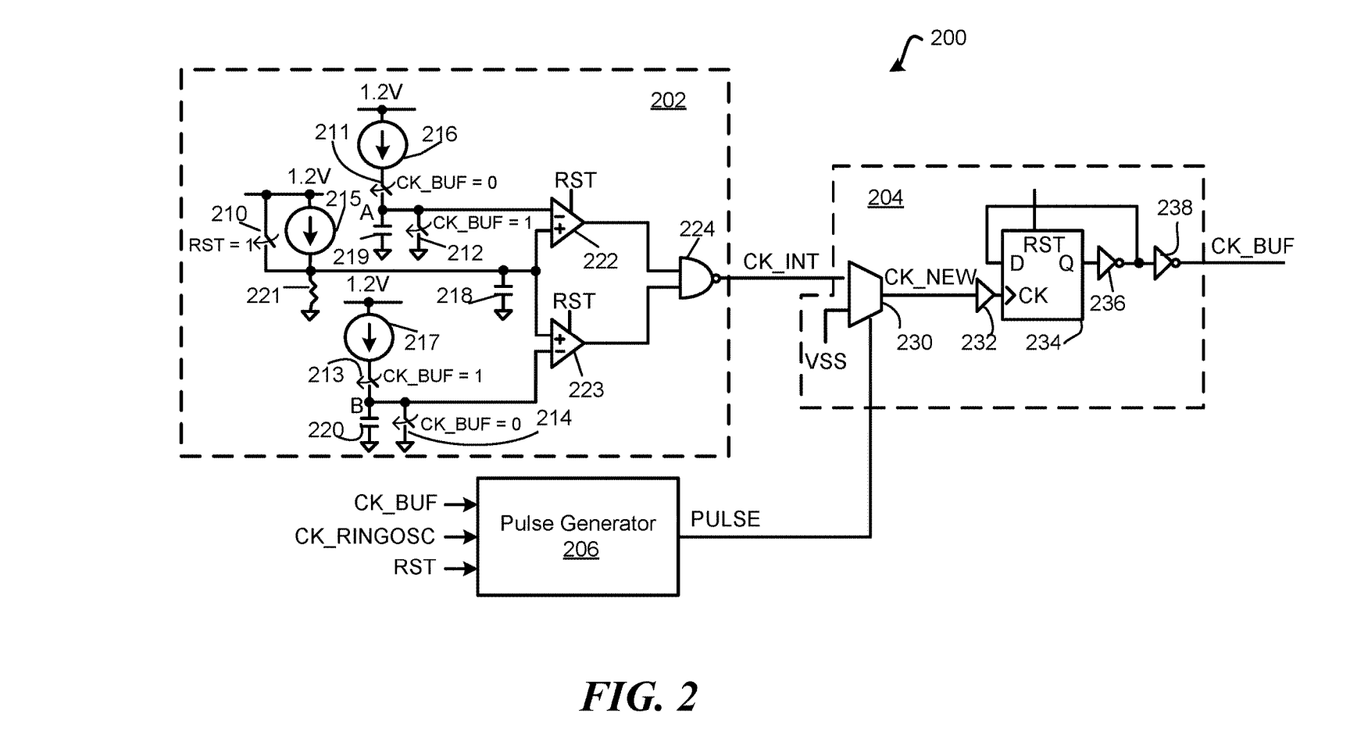
FIG. 2 illustrates a schematic and block diagram of an embodiment of the integrated circuit FIG. 1 according to at least one embodiment of the present disclosure.

FIG. 2 illustrates a schematic and block diagram of an embodiment of an integrated circuit 200 according to at least one embodiment of the present disclosure. In an embodiment, the integrated circuit 200 can be an implementation of the integrated circuit 100 of FIG. 1. The integrated circuit 200 includes an internal reference clock (IRC) generator 202, a sequential circuit 204, and a pulse generator 206. The IRC generator 202 can be implemented in multiple different ways with different components from those shown in FIG. 2 without varying from the scope of the disclosure. Thus, the IRC generator 202 in FIG. 2 is only one possible embodiment, of the IRC generator 102 and will briefly be described herein. The IRC generator 202 includes a power supply voltage reference bus that is illustrated to provide a power supply voltage of 1.2 Volts. The IRC generator 202 includes switches 210, 211, 212, 213, and 214, current sources 215, 216, and 217, capacitors 218, 219, and 220, a resistor 221, comparators 222 and 223, and a NAND logic gate 224.

By asserting reset of the IRC generator 202, the output of each of the comparators 222 and 223 is driven to at a high voltage state, such that the internal clock signal CK_INT provided from NAND gate 224 is in a low voltage state. When reset is negated, a reference voltage is provided to the positive terminals of comparators 222 and 223 by virtue of the opening of the switch 210 causing the current source 215 to generate a reference voltage via the resistor 221 and the capacitor 218 in the reference voltage branch of the IRC generator 202. During normal operation, CK_BUF can initialize to a low voltage in response to the RST signal being negated. When CK_BUF is driven to low voltage state, in reference to the RST signal being negated, switch 211 is closed allowing current source 216 to charge the capacitor 219. When the voltage on node "A" transitions above reference voltage, the comparator 222 toggles to a logic low state. In response, the NAND gate 224 generates a logic high on the internal clock signal, CK_INT, which causes the IRC clock signal, CK_BUF, output from the sequential circuit 204 to change state to logic high level. The IRC clock signal, CK_BUF, logic high level causes switch 211 to open, causing node A to be pulled to ground via switch 212. The comparator 222 will then transition high, causing the internal clock signal, CK_INT, output from NAND gate 224 go low. The comparator 223 sees the current source 217 charge capacitor 220 through switch 213, which is closed with the IRC clock signal, CK_BUF, at logic high level. The voltage at node B starts to increase and when it crosses the reference voltage threshold, the comparator 223 generates an output logic low level, which in turn generates a high state on the internal clock signal, CK_INT, output from the NAND gate 224. In response, the sequential circuit 204 toggles the IRC clock signal, CK_BUF, to make the IRC clock signal, CK_BUF, go to logic low again and this process continues throughout to generate a clock on the output of the sequential circuit 204.

If the comparator reference voltage, for comparators 222 and 223, has noise which takes it higher than the node A and shortly after take it to lower than the voltage level on node B before the flip flop 234 in the sequential circuit 204 can toggle, then the IRC circuitry 202 can enter a deadlock. The output of the comparator 222 may remain at logic low throughout because the IRC clock signal, CK_BUF, could not toggle to logic high state to discharge node A in order to recover comparator 222 to a logic high state. In response the internal clock signal, CK_INT, from the IRC generator 202 remains indefinitely at logic high state.

The sequential circuit 204 can be one implementation of the sequential circuit 104 of FIG. 1. The sequential circuit 204 includes a multiplexor 230, a delay element 232, a D-flip flop logic device 234, and inverters 236 and 238. The multiplexor 230 includes first and second input terminals, a select terminal, and an output terminal. The multiplexor 230 receives the internal clock signal, CK_INT, from the IRC generator 202 at the first input terminal, a low voltage, VSS, at the second input terminal, and is connected to the pulse generator 206 via the select terminal. The output terminal of the multiplexor 230 is connected to a clock input terminal of the D-flip flop logic device 234 via the delay element 232.

During operation, the output signal of the D-flip flop logic device 234 is inverted by the invertor 236 and then feedback to the input terminal of the D-flip flop logic device 234. The output signal is then inverted again by invertor 238 to provide the IRC clock signal, CK_BUF, at an output terminal of the sequential circuit 204. The configuration of the D-flip flop logic device 234 can cause the IRC clock signal, CK_BUF, to switch states (i.e., from a high to low state or from a low to a high state) in response to each rising edge of the clock signal, CK NEW, received from the multiplexor 230 via the delay element 232.

During operation, the pulse generator 206 does not provide a signal on its output terminal, such that the select terminal of the multiplexor 230 is at a low state and the internal clock signal, CK_INT, received at the first input is passed through to the D-flip flop logic device 234. However, as similarly explained above for the IRC generator 102, the IRC generator 202 can enter into a deadlock and the internal clock signal, CK_INT, may no longer switch states. Thus, during the deadlock, the clock signal, CK NEW, provided to the D-flip flop logic device 234 does not change and the IRC clock signal, CK_BUF, remains in the same state.

The pulse generator 206 includes a first input terminal to receive the reset signal, RST, a second input terminal to receive a slow ring oscillator clock signal, labeled CK_RINGOSC, a third input terminal to receive a feedback of the IRC clock signal, CK_BUF, and an output terminal connected to the select terminal of the multiplexor 230.

During operation, the pulse generator 206 can monitor the feedback of the IRC clock signal, CK_BUF, in response to receiving the reset signal as described above for the pulse generator 206. The pulse generator 206 can include a counter, such as counter 108 of FIG. 1, to count a number of clock edges of the IRC clock signal during a single period of the ring clock signal, CK_RINGOSC, and the count can begin with a rising edge of the ring clock signal. The pulse generator 206 can also include a comparator, such as comparator 110 of FIG. 1, which can compare the number of IRC clock edges to a value of zero. In response to a failing edge of the ring clock signal, CK_RINGOSC, being detected the count of the IRC clock edges is ended, and the number of clock edges is provided to the comparator. If the comparator determines that the number of IRC clock signals is equal to zero, then an IRC deadlock is determined. In response to a determination of an IRC deadlock, a high state pulse is provided to select terminal of multiplexor 230 the sequential circuit 204.

The high state pulse can then cause the multiplexor 230 to output the low voltage, VSS, to the D-flip flop logic device 234. Then after the pulse is no longer provided by the pulse generator 206, the multiplexor 230 can again output the state of the internal clock signal, CK_INT, which can cause a clock edge to be provided to the D-flip flop logic device 234, which in turn can toggle its output and force the IRC generator 202 out of deadlock.

Figure 3:
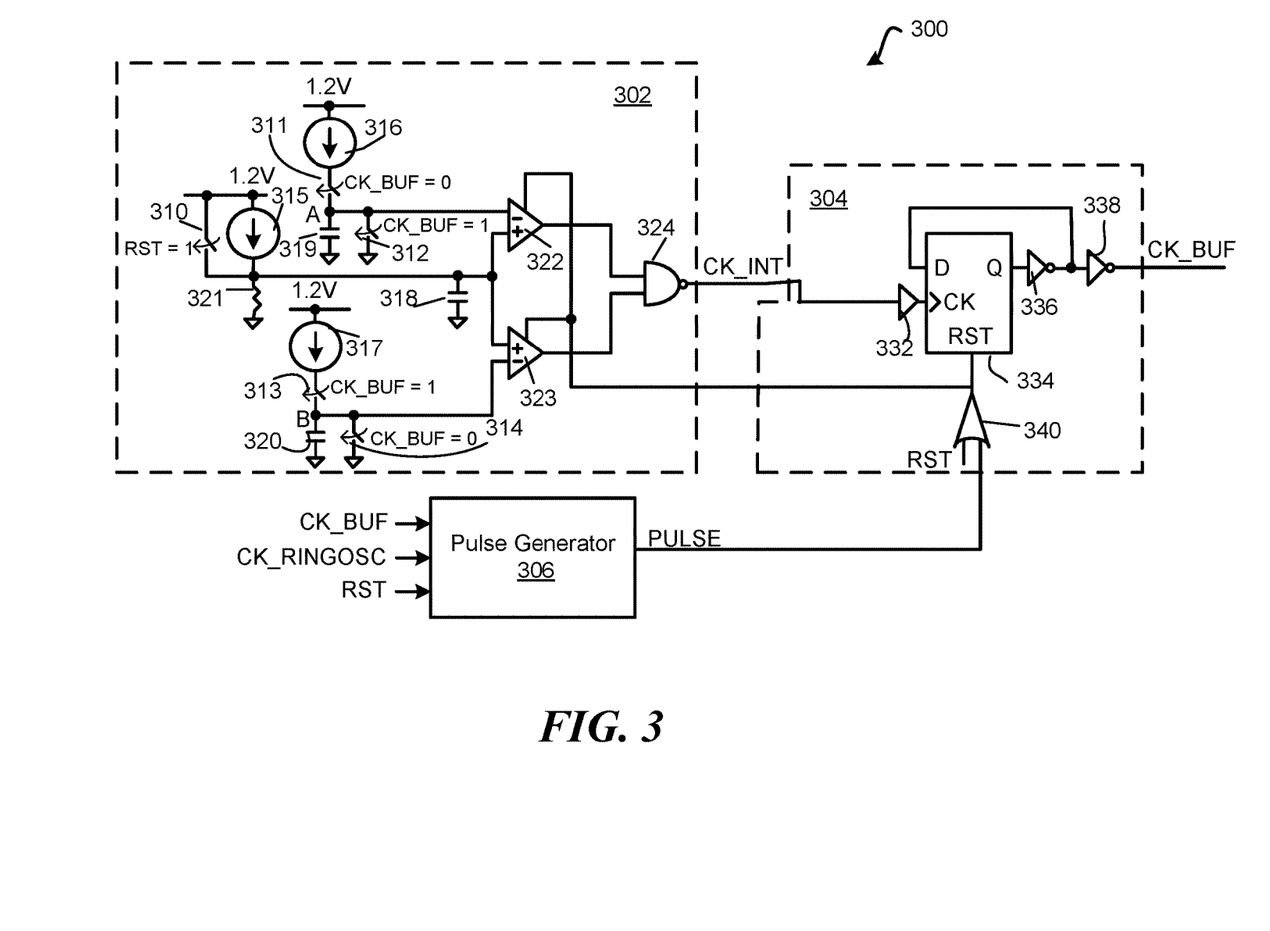
FIG. 3 illustrates a schematic and block diagram of another embodiment of the integrated circuit FIG. 1 according to at least one embodiment of the present disclosure.

FIG. 3 illustrates a schematic and block diagram of another embodiment of an integrated circuit 300 according to at least one embodiment of the present disclosure. In an embodiment, the integrated circuit 300 can be an implementation of the integrated circuit 100 of FIG. 1. The integrated circuit 300 includes an internal reference clock (IRC) generator 302, a sequential circuit 304, and a pulse generator 306. The IRC generator 302 can be implemented in multiple different ways with different components from those shown in FIG. 3 without varying from the scope of the disclosure. Thus, the IRC generator 302 in FIG. 3 is only one possible embodiment, of the IRC generator 302 and can include the same components, such as switches 310, 311, 312, 313, and 314, current sources 315, 316, and 317, capacitors 318, 319, and 320, a resistor 321, comparators 322 and 323, and a NAND logic gate 324, and operate in substantially the same manner as the IRC generator 202 of FIG. 2.

The sequential circuit 304 can be another implementation of the sequential circuit 104 of FIG. 1. The sequential circuit 304 includes a delay element 332, a D-flip flop logic device 334, and inverters 336 and 338, and an OR logic gate 340. In this embodiment, the internal clock signal, CK_INT, is connected to a clock input terminal of the D-flip flop logic device 334 via the delay element 332. The OR gate 340 can provide a reset signal or pulse to a reset terminal of the D-flip flop logic device 334 and to terminals of the comparators 318 in response to either a reset signal being received at a first input terminal of the OR gate 340 or a pulse being received at a second input terminal of the OR gate 340. During operation, the D-flip flop logic device 334 can operate substantially similar to the D-flip flop logic device 234 of FIG. 2.

During operation, the pulse generator 306 is substantially similar to the pulse generator 206 of FIG. 2. If a deadlock is determined, the pulse generator 306 provides the pulse to the OR gate 340, which in turn can provide the pulse to the reset terminal of the D-flip flop logic device 334 and to the terminals of the comparators 322 and 323. The reset of the D-flip flop logic device 334 and the comparators 322 and 323 can reset both the D-flip flop logic device 334 and the IRC generator 302 to force the IRC generator 302 out of deadlock.

Figure 4:
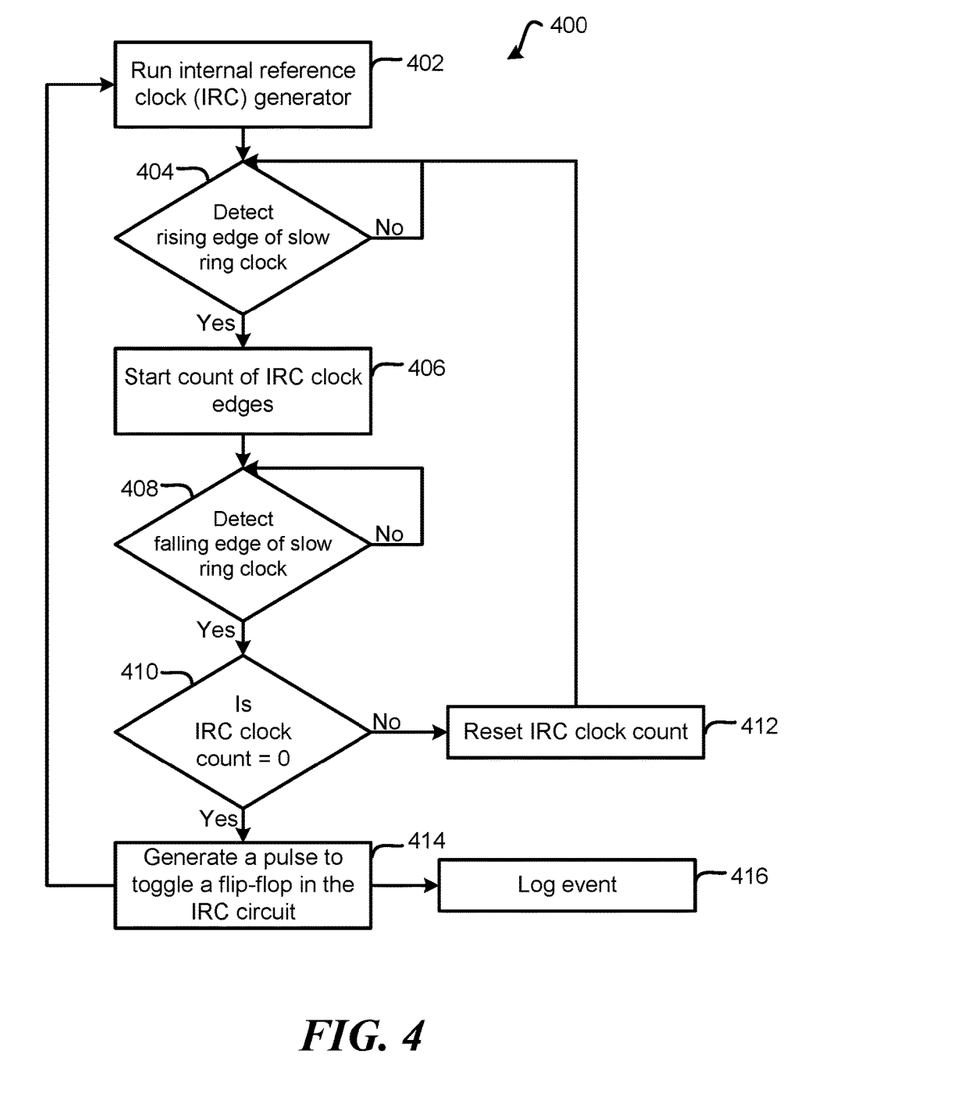
FIG. 4 illustrates a flow diagram of a method for generating a pulse to cause an internal reference clock of the integrated circuit FIG. 1 to come out of a deadlock according to at least one embodiment of the present disclosure.

FIG. 4 illustrates a flow diagram of a method 400 for generating a pulse to cause an internal reference clock of the integrated circuit FIG. 1 to come out of a deadlock according to at least one embodiment of the present disclosure. At block 402 an IRC generator is run. The IRC generator can produce an IRC clock signal that can be utilized by an integrated circuit, such as a microcontroller unit. A determination is made, at block 404, whether a rising edge of a slow ring oscillator clock signal is detected. The slow ring oscillator clock signal can be a slow frequency clock signal as compared to the IRC clock signal.

In response to the rising edge of the slow ring oscillator clock signal being detected, a count of clock edges of the IRC clock signal is started at block 406. At block 408, a determination is made whether a failing edge of the slow ring oscillator clock signal is detected. In different embodiment, the detection of rising and failing edges of the slow ring oscillator clock signal can be reversed without varying from the scope of the present disclosure. At block 410, a determination is made whether the count of IRC clock signal edges is equal to zero. If the count is not equal to zero, the count is reset at block 412, and the flow continues as stated above at block 402. If the count is equal to zero, a pulse is generated at block 414. In an embodiment, when the count is equal to zero the IRC generator is determined to be in a deadlock, such that the IRC clock signal is not changing. Different situations can arise that can cause the IRC circuitry to deadlock. For example, if the sequential circuit attains a wrong state, then a feedback loop within IRC circuitry can enter into a deadlock. Additionally, noise on a power supply voltage provided to the IRC circuitry can also cause the IRC circuitry to deadlock. Further, an asynchronous reset signal can cause a glitch in the output clock signal.

The pulse can be provided to a sequential circuit and cause an output of the sequential circuit to toggle. In an embodiment, the pulse can be provided to a multiplexor or the sequential circuit, which in turn can provide an additional clock edge to a D-flip flop of the sequential circuit to toggle the output. In another embodiment, the pulse can be provided to an OR gate of the sequential circuit, and the OR gate can then provide the pulse to a reset terminal of the D-flip flop to reset and toggle the output of the D-flip flop. At block 416, the IRC generator deadlock event is logged.

Figure 5:
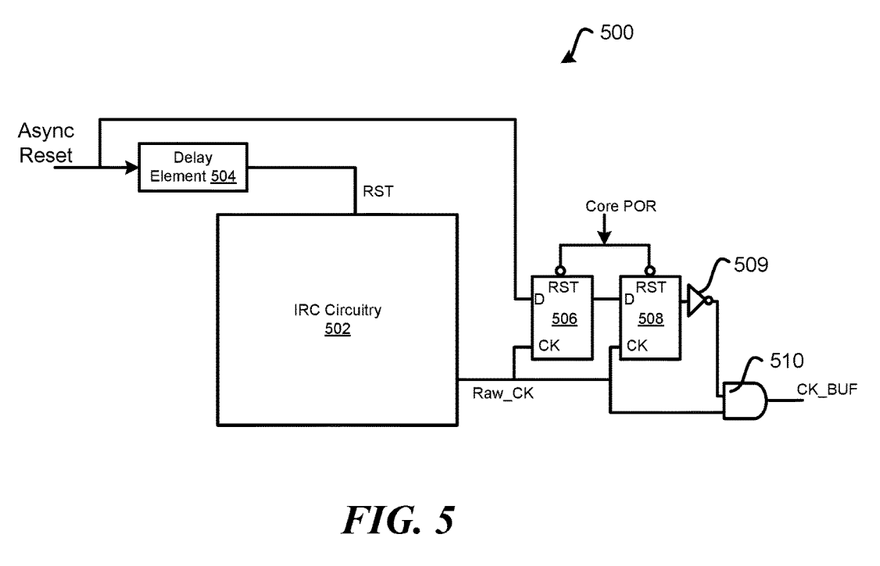
FIG. 5 illustrates a schematic and block diagram of another embodiment of the integrated circuit FIG. 1 according to at least one embodiment of the present disclosure.

FIG. 5 illustrates a schematic and block diagram of an embodiment of an integrated circuit 500 according to at least one embodiment of the present disclosure. The integrated circuit 500 includes IRC circuitry 502, a delay element 504, D-flip flop logic elements 506 and 508, an inverter 509, and an AND gate 510. In an embodiment, the IRC circuitry 502 can include the elements within the IRC generator 202, the sequential circuit 204, and the pulse generator 206 of FIG. 2. In another embodiment, the IRC circuitry 502 can include the elements within the IRC generator 302, the sequential circuit 304, and the pulse generator 306 of FIG. 3.

The IRC circuitry 502 includes an input terminal and an output terminal. The delay element 504 includes an input terminal to receive an asynchronous reset signal, Async Reset, and an output terminal to provide the asynchronous reset signal to the input terminal of the IRC circuitry 502. The asynchronous reset signal can be defined as asynchronous based on the reset signal being provided to the IRC circuitry 502 at a time point in time different from when a core power on reset (POR) signal is provided to the D-flip flop devices 506 and 508. The D-flip flop devices 506 and 508 are connected together, such that the output terminal of the D-flip flop devices 506 is connected to the input terminal of the D-flip flop device 508. The D-flip flop devices 506 and 508 can each receive a core POR at its corresponding reset terminal. The input terminal of D-flip flop device 506 can receive the asynchronous reset signal. The D-flip flop devices 506 and 508 can receive a clock signal, Raw_CK, from the IRC circuitry 502. The AND gate 510 includes a first input terminal connected to the output terminal of the D-flip flop device 508, a second input terminal connected to the output terminal of the IRC circuitry 502, and an output terminal.

During operation of the integrated circuitry 500, an asynchronous reset signal can be provided to the IRC circuitry 502. However, the asynchronous reset signal may cause a glitch in the clock signal provided by the IRC circuitry 502 during the reset. For example, the glitch can be that the output clock signal from the IRC circuitry 502 can enter into an undefined state. The delay element 504 and the D-flip flop devices 506 and 508 can combine to prevent the glitch in an IRC clock signal, CK_BUF. In an embodiment, the delay of the delay element 504 can be much greater than the frequency of the clock signal, Raw_CK, from the IRC circuitry 502.

When an asynchronous level high reset is detected, a high logic state is clocked through the D-flip flop devices 506 and 508 at the frequency of the clock signal, Raw_CK, provided by the IRC circuitry 502. The invertor 509 connected to the output of D-flip flop device 508 can produce a logic level low to the first input of the AND gate 510, which can produce a logic low state on CK_BUF output of the AND gate. The IRC circuitry 502 can receive the asynchronous logic high reset delayed by delay element 504 and during this time, the clock signal, CK_BUF, is correctly safely stated to logic low without any glitch. When the IRC circuitry 502 gets the asynchronous logic high reset, it may produce a glitch on clock signal, Raw_CK, but it has no effect on the clock signal, CK_BUF, since the first input of the AND gate 510 is already at logic level low state.

At start up of the integrated circuit 500, the delay element 504 can cause the clock signal, Raw_CK, from the IRC circuitry 502 to start delayed. However, no problem will arise from this delay based on a synchronizer formed by the D-flip flop devices 506 and 508, and the AND gate 510. The only result of the delay is that the output clock signal, CK_BUF, will be delayed by two clock cycles of the clock signal, Raw_CK, from the IRC circuitry 502. This delay can then cause the boot time of the integrated circuit 500 to increase by the length of the delay.

In a first aspect, a method can include producing, by an internal reference clock generator circuit of an integrated circuit, a first clock signal. The method can further include counting, by the pulse generator circuit, a number of internal reference clock edges during a single clock cycle of a slow oscillator ring clock signal. The method can also include determining whether the number is equal to zero. The method can further include generating a pulse to switch a state of an output a flip-flop clock circuit in response to the number of the internal reference clock edges being equal to zero. In one embodiment, the method can further include resetting the count of the internal reference clock edges in response to the number of the internal reference clock edges being greater than zero. In an embodiment, the method can also include providing the pulse to a multiplexor a select input terminal. In this embodiment, the method can further include outputting a low voltage signal on an output terminal of the multiplexor in response to the pulse provided to the select input terminal, wherein the output of the low voltage signal causes the toggle of the flip-flop clock circuit.

In another embodiment, the method can include providing the pulse to an OR gate. In this embodiment, the method can also include outputting the pulse from the OR gate, wherein the output of the pulse from the OR gate causes a reset of the flip-flop clock circuit. In one embodiment of the first aspect, the method can include delaying, via a delay element, an asynchronous reset signal prior to the asynchronous reset signal being received by the internal reference clock generator circuit. In a particular embodiment, the method can include increasing a boot time of the integrated circuit by a length of the delay. In another particular embodiment, the method can include preventing a glitch in the internal reference clock signal during an asynchronous reset based on the delay to the IRC circuitry being higher than the IRC clock period. In an embodiment, the method can include logging a deadlock of the internal reference clock generator circuit in response to the number being greater than zero.

In a second aspect, a clock generator circuit can include an internal reference clock generator circuit having a first input terminal to receive a clock buffer signal, a second input terminal to receive a reset signal, and an output terminal to provide a first clock signal. The clock generator circuit can also include a sequential circuit having an input terminal to receive the first clock signal from the internal reference clock generator circuit and an output terminal and to provide an internal reference clock signal on an output terminal based on the first clock signal from the internal reference clock generator circuit. The clock generator circuit can further include a pulse generator circuit having a first input terminal to receive the internal reference clock signal from the flip-flop clock circuit, a second input terminal to receive a slow ring oscillator clock signal, a third input terminal to receive the reset signal, an output terminal to provide a pulse signal, a counter to count a number of internal reference clock signals cycles for each cycle of the slow ring oscillator clock signal, and a comparator to generate the pulse signal in response to the count number being equal to zero during a cycle of the slow ring oscillator clock signal, the pulse signal to enable the clock generator circuit to recover from a deadlock.

In an embodiment of the clock generator circuit, the pulse signal is provided to a multiplexor of the sequential circuit. In this embodiment of the clock generator circuit, the multiplexor is configured to provide an additional clock edge to the sequential circuit in response to the pulse signal. In an embodiment of the clock generator circuit, the pulse signal is provided to an OR gate of the sequential circuit. In this embodiment of the clock generator circuit, the OR gate configured to provide a reset signal to the flip-flops in the sequential circuit in response to the pulse signal.

In an embodiment, the clock generator circuit further includes a delay element coupled to the internal reference clock generator circuit, the delay element to delay an asynchronous reset signal prior to the asynchronous reset signal. In this embodiment, the delay element further to increase a boot time of the integrated circuit by a length of the delay. In this embodiment, the delay prevents a glitch in the internal reference clock signal during an asynchronous reset.

In a second aspect, a method can include producing, by an internal reference clock generator circuit of an integrated circuit, a first clock signal. The method also can include detecting, by a pulse generator circuit of the integrated circuit, a first edge of a slow oscillator ring clock signal. The method can further include starting, by the pulse generator circuit, a count of internal reference clock edges in response to detecting the first edge of the slow oscillator ring clock signal. The method can also include detecting, by the pulse generator circuit, a second edge of a slow oscillator ring clock signal. The method can further include ending the count of the internal reference clock edges. The method can also include determining whether the count of the internal reference clock edges is equal to zero. The method can further include generating a pulse to switch a state of an output of a flip-flop clock circuit in response to the count of the internal reference clock edges being equal to zero.

In one embodiment of the third aspect, the method can also include resetting the count of the internal reference clock edges in response to the count of the internal reference clock edges being greater than zero. In one embodiment of the third aspect, the method can include providing the pulse to a multiplexor a select input terminal. In this embodiment, the method can also include outputting a low voltage signal on an output terminal of the multiplexor in response to the pulse provided to the select input terminal, wherein the output of the low voltage signal causes the switch of the flip-flop clock in the sequential circuit. In one embodiment of the third aspect, the method can include providing the pulse to an OR gate. In this embodiment, the method can also include outputting the pulse from the OR gate, wherein the output of the pulse from the OR gate causes a reset of the flip-flop in the sequential circuit.

It will be further appreciated that in embodiments there may be additional intervening circuitry, not shown in the figures, between connections and circuitry depicted in the figures. In particular embodiments, such additional intervening circuitry does not affect the operation of the disclosed invention as described herein.

What is claimed is:

1. A method comprising:
   producing, by an internal reference clock generator circuit of an integrated circuit, a first clock signal;
   counting, by the pulse generator circuit, a number of internal reference clock edges during a single clock cycle of a slow oscillator ring clock signal;
   determining whether the number is equal to zero; and
   generating a pulse to switch a state of an output of a flip-flop clock circuit in response to the number of the internal reference clock edges being equal to zero.

2. The method of claim 1, further comprising:
   resetting the count of the internal reference clock edges in response to the number of the internal reference clock edges being greater than zero.

3. The method of claim 1, further comprising:
   providing the pulse to a multiplexor a select input terminal; and
   outputting a low voltage signal on an output terminal of the multiplexor in response to the pulse provided to the select input terminal, wherein the output of the low voltage signal causes the toggle of the flip-flop clock circuit.

4. The method of claim 1, further comprising:
   providing the pulse to an OR gate; and
   outputting the pulse from the OR gate, wherein the output of the pulse from the OR gate causes a reset of the flip-flop clock circuit.

5. The method of claim 1, further comprising:
   delaying, via a delay element, an asynchronous reset signal prior to the asynchronous reset signal being received by the internal reference clock generator circuit.

6. The method of claim 5, further comprising:
   increasing a boot time of the integrated circuit by a length of the delay.

7. The method of claim 5, further comprising:
   preventing a glitch in the internal reference clock signal during an asynchronous reset based on the delay to the IRC circuitry being higher than the IRC clock period.

8. The method of claim 1, further comprising:
   logging a deadlock of the internal reference clock generator circuit in response to the number being greater than zero.

9. A clock generator circuit comprising:
   an internal reference clock generator circuit having a first input terminal to receive a clock buffer signal, a second input terminal to receive a reset signal, and an output terminal to provide a first clock signal;
   a sequential circuit having an input terminal to receive the first clock signal from the internal reference clock generator circuit and an output terminal and to provide the clock buffer signal on the output terminal based on the first clock signal from the internal reference clock generator circuit; and
   a pulse generator circuit having a first input terminal to receive the internal reference clock signal from the flip-flop clock circuit, a second input terminal to receive a slow ring oscillator clock signal, a third input terminal to receive the reset signal, an output terminal to provide a pulse signal, a counter to count a number of clock buffer signals cycles for each cycle of the slow ring oscillator clock signal, and a comparator to generate the pulse signal in response to the count number being equal to zero during a cycle of the slow ring oscillator clock signal, the pulse signal to enable the clock generator circuit to recover from a deadlock.

10. The clock generator circuit of claim 9, wherein the pulse signal is provided to a multiplexor of the sequential circuit.

11. The clock generator circuit of claim 9, the multiplexor configured to provide an additional clock edge to the sequential circuit in response to the pulse signal.

12. The clock generator circuit of claim 9, wherein the pulse signal is provided to an OR gate of the sequential circuit.

13. The clock generator circuit of claim 12, the OR gate configured to provide a reset signal to the flip-flops in the sequential circuit in response to the pulse signal.

14. The clock generator circuit of claim 9, the sequential circuit further comprising:
   a delay element coupled to the internal reference clock generator circuit, the delay element to delay an asynchronous reset signal provided to the internal reference clock generator circuit; and
   a D-flip flop device clocked by the asynchronous reset signal.

15. The clock generator circuit of claim 14, wherein the delay prevents a glitch in the clock buffer signal during an asynchronous reset.

16. The clock generator circuit of claim 14, the delay element further to increase a boot time of the integrated circuit by a length of the delay.

17. A method comprising:
   producing, by an internal reference clock generator circuit of an integrated circuit, a first clock signal;
   detecting, by a pulse generator circuit of the integrated circuit, a first edge of a slow oscillator ring clock signal;
   starting, by the pulse generator circuit, a count of internal reference clock edges in response to detecting the first edge of the slow oscillator ring clock signal;
   detecting, by the pulse generator circuit, a second edge of a slow oscillator ring clock signal;
   ending the count of the internal reference clock edges;
   determining whether the count of the internal reference clock edges is equal to zero; and
   generating a pulse to switch a state of an output of a flip-flop clock circuit in response to the count of the internal reference clock edges being equal to zero.

18. The method of claim 17, further comprising:
   resetting the count of the internal reference clock edges in response to the count of the internal reference clock edges being greater than zero.

19. The method of claim 17, further comprising:
   providing the pulse to a multiplexor a select input terminal; and
   outputting a low voltage signal on an output terminal of the multiplexor in response to the pulse provided to the select input terminal, wherein the output of the low voltage signal causes the switch of the flip-flop clock in the sequential circuit.

20. The method of claim 17, further comprising:
   providing the pulse to an OR gate; and
   outputting the pulse from the OR gate, wherein the output of the pulse from the OR gate causes a reset of the flip-flop in the sequential circuit.

* * * * *